United States Patent [19]
Seki et al.

[11] Patent Number: 5,097,159
[45] Date of Patent: Mar. 17, 1992

[54] DELAY CIRCUIT FOR DELAYING AN OUTPUT SIGNAL RELATIVE TO AN INPUT SIGNAL FOR A SPECIFIED TIME INTERVAL

[75] Inventors: Teruo Seki; Akihiro Iwase, both of Kasugai; Sinzi Nagai, Toki, all of Japan

[73] Assignees: Fujitsu Limited, Kawasaki; Fujitsu VLSI Limited, Kasugai, both of Japan

[21] Appl. No.: 312,163

[22] Filed: Feb. 21, 1989

[30] Foreign Application Priority Data

Feb. 22, 1988 [JP] Japan .................. 63-38809

[51] Int. Cl.$^5$ ............................................. H03K 5/13
[52] U.S. Cl. ..................... 307/594; 307/595; 307/597; 307/602; 307/605
[58] Field of Search ............... 307/594, 603, 605, 585, 307/451, 595, 597, 602

[56] References Cited

U.S. PATENT DOCUMENTS

| 4,700,089 | 10/1987 | Fujii et al. ........................ 307/594 |
| 4,868,627 | 9/1989 | Yamada et al. .................... 307/585 |

FOREIGN PATENT DOCUMENTS

| 0171022 | 2/1986 | European Pat. Off. ............ 307/605 |
| 59-66218 | 4/1984 | Japan . |
| 59-66219 | 4/1984 | Japan . |
| 59-66220 | 4/1984 | Japan . |
| 62-157420 | 7/1987 | Japan . |

OTHER PUBLICATIONS

Grimes, "Signal Transition Detector", IBM Technical Disclosure Bulletin, vol. 18, No. 12, May 1976, pp. 3905-3906.

"Device Parameter Independent Delay Circuit", IBM Technical Disclosure Bulletin, vol. 31, No. 1, Jun. 1988, pp. 21-23.

Primary Examiner—Stanley D. Miller
Assistant Examiner—Trong Phan
Attorney, Agent, or Firm—Armstrong, Nikaido, Marmelstein, Kubovcik & Murray

[57] ABSTRACT

A delay circuit having two or more first switching transistors connected in series between an output terminal and a power source line, and two or more second switching transistors connected in series between the output terminal and another power source line, the first and the second switching transistors operating in a complementary manner in response to an input signal, one or more nodes of each switching transistor being connected by one or more current paths each connecting at least one capacitor, whereby an input signal is transmitted to the output terminal at a specified interval defined by the capacitance of the capacitor.

45 Claims, 11 Drawing Sheets

DELAY CIRCUIT FOR DELAYING AN OUTPUT SIGNAL RELATIVE TO AN INPUT SIGNAL FOR A SPECIFIED TIME INTERVAL

BACKGROUND OF THE INVENTION (1) Field of the Invention

The present invention relates to a delay circuit in which the output signal is delayed by a specified time interval with respect to the input of both a rising edge and a falling edge, and able to work reliably and to obtain a sufficient delay time at a low power source voltage.

(2) Description of the Related Art

Generally, in digital circuits, it is frequently necessary to change the transmission time of the signal, i.e., a plurality of signals should be transmitted t the same time or should be transmitted at predetermined intervals, and a digital circuit is used for transmitting the signals at predetermined intervals.

Known conventional delay circuits are composed of switching transistors, such as FET's. FIG. 1, 2, 3, and 4 show typical prior art delay circuits composed of FET's, and to delay the signal, a Schmitt trigger circuit is used in the circuits of FIGS. 1 and 2, a network of capacitors and resistors (CR network) is used in the circuit of FIG. 3, and a multistage inverter circuit is used in the circuit of FIG. 4. Note, the FET's marked o in the drawings are P-channel FET's.

In the circuit of FIG. 1, the Schmitt trigger circuit 10 is composed of two P-channel FET's 11, 12 and two N-channel FET's 13, 14. The P-channel FET 11 and N-channel FET's 13 and 14 are connected in series between a high level constant power supply Vcc and a low level constant power supply Vss. The P-channel FET 12 is connected between the high level constant power supply Vcc and a node $N_2$, which serves as a connecting point for the N-channel FET's 13 and 14. The gates of the FET's 11, 12, 13, and 14 are connected to the input terminal IN, and a node $N_1$ is connected to the output terminal OUT of the Schmitt trigger circuit 10.

When the input terminal IN is low level, the P-channel FET's 11 and 12 are ON (conduction occurs between the source and drain) and the N-channel FET's 13 and 14 are OFF (no conduction occurs between the source and drain), and thus the nodes $N_1$ and $N_2$ are high levels. When the level changes from low level to high level at the input terminal IN, the P-channel FET's 11 and 12 become OFF and the N-channel FET 14 becomes ON immediately the input level passes the threshold voltage, but the N-channel FET 13 cannot become ON at the same time because the nodes $N_1$ and $N_2$ are both high levels. The N-channel FET 13 becomes ON after the node $N_2$ is connected to the low level constant power supply Vss through the N-channel FET 14 and the level thereof becomes low. A delay occurs while the node $N_2$ is changed from high level to low level, which supplies the threshold voltage to the gate of FET 13 after the N-channel FET 14 becomes ON. When the N-channel FET 13 becomes ON, the level of the output terminal OUT is changed from high level to low level. Accordingly, the change of the level from low to high at the input terminal IN is transmitted to the output terminal OUT in the opposite direction at a predetermined interval.

In FIG. 2, the Schmitt trigger circuit 20 is composed of two P-channel FET's 21 and 22 and two N-channel FET's 23 and 24. The P-channel FET's 21 and 22 and N-channel FET 23 are connected in series between a high level constant power supply Vcc and a low level constant power supply Vss. The N-channel FET 24 is connected between the low level constant power supply Vss and a node $N_3$ which serves as a connecting point for the P-channel FET's 21 and 22. The gates of the FET's 21, 22, 23, and 24 are connected to the input terminal IN, and a node $N_4$ is connected to the output terminal OUT of the Schmitt trigger circuit 20.

When the input terminal IN is high level, the N-channel FET's 23 and 24 are ON and the P-channel FET's 21 and 22 are OFF, and the nodes $N_3$ and $N_4$ are low levels. When the level changes from high level to low level at the input terminal IN, the N-channel FET's 23 and 24 immediately become OFF and the P-channel FET 21 becomes ON, but the P-channel FET 22 cannot become ON immediately because the nodes $N_3$ and $N_4$ are both low levels. Therefore, the P-channel FET 22 becomes ON after the node $N_3$ is connected to the high level constant power supply Vcc through the P-channel FET 21 and the level thereof becomes high. A delay occurs while that the node $N_3$ is changed from low level to high level after the P-channel FET 21 becomes ON. When the P-channel FET 22 becomes ON, the level of the output terminal OUT is changed from low level to high level, then in the same way as described in FIG. 1, the change of the level from high to low at the input terminal IN is transmitted to the output terminal OUT in the opposite direction at a predetermined interval.

In FIG. 3, the delay circuit 30 is composed of two inverters 31 and 33, and a CR network 32. Each of the inverters 31 and 33 comprises a P-channel FET and an N-channel FET connected in series between a high level constant power supply Vcc and a low level constant power supply Vss. The CR network 32 comprises two capacitors $C_1$ and $C_2$, and a resistor R.

When the input signal is low level, the input signal to the CR network is high level, and accordingly the capacitor $C_2$ is charged and the capacitor $C_1$ is discharged. When the signal changes from low level to high level at the input terminal IN, the signal at the output of the inverter 31 is changed from high level to low level, thereby discharging the capacitor $C_2$ and charging the capacitor $C_1$. As a result, the signal input to the CR network 32 is sent to the output of the CR network 32 after a predetermined delay, in accordance with the time constant defined by capacitors $C_1$ and $C_2$, and the resistor R. This delayed signal is then inverted by the inverter 33. When the signal changes from high level to low level, the delay operation in this circuit 30 is also carried out, and accordingly, the signal to the input terminal IN is transmitted to the output terminal OUT at a predetermined interval.

In FIG. 4, the delay circuit 40 is composed of a multistage inverter, i.e., the delay circuit 40 comprises a plurality of inverters 41, 42, ... 4n. Each inverter comprises a P-channel FET and an N-channel FET connected in series between a high level constant power supply Vcc and a low level constant power supply Vss. In this delay circuit 40, a signal input to the input terminal IN is delayed by each inverter circuit, due to a switching time lag thereof. The delay time is defined by the number of inverters in the delay circuit 40.

In the delay circuits shown in FIGS. 1 and 2, the delay operations can be carried out for a one way change of the input signal. Namely, the Schmitt trigger circuit 10 shown in FIG. 1 delays the input signal only upon a change from low level to high level, and the Schmitt trigger circuit 20 shown in FIG. 2 delays the input signal only upon a change from high level to low level FIGS. 5A, 5B, and 5C shown waveforms for explaining the operation of the delay circuit as shown in FIGS. 1 and 2 when the voltage of the high level constant power supply Vcc is 5 V. In FIG. 5A, the waveform indicates a signal input to the input terminal IN of the circuits 10 and 20. The input signal changes at time $t_1$ and time $t_2$. In FIG. 5B, the waveform indicates a signal output from the output terminal OUT of the circuit 10, and in FIG. 5C, the waveform indicates a signal output from the output terminal OUT of the circuit 20. FIG. 6A, 6B, and 6C show waveforms for explaining the operation of the delay circuit as shown in FIGS. 1 and 2 when the voltage of the high level constant power supply Vcc is less than 3 V, for example, 1.5 V. In FIG. 6A, the waveform indicates a signal input to the input terminal IN of the circuits 10 and 20. The input signal changes at time $t_1$ and time $t_2$. In FIG. 6B, the waveform indicates a signal output from the output terminal OUT of the circuit 10, and in FIG. 6C, the waveform indicates a signal output from the output terminal OUT of the circuit 20. From FIGS. 5B, 5C, 6B, and 6C, it is clearly understood that the circuit 10 shown in FIG. 1 delays the input signal only upon a change from low level to high level, and the circuit 20 shown in FIG. 2 delays the input signal only upon a change from high level to low level.

In the delay circuit shown in FIG. 3, a delay operation can be carried out for a rising or falling input signal at the input terminal IN, as shown in FIGS. 5A and 5D, when the voltage of the high level constant power supply Vcc is 5 V. Conversely, in the delay circuit shown in FIG. 3, the delay time is not stable when the voltage of the high level constant power supply Vcc is less than 3 V, for example, 1.5 V, because the response of the CR network is blunted under the low voltage condition, as shown in FIG. 6D. Further, when the response of the CR network is blunted, a wave shaping circuit must be included for compensating the weakened output signal.

In the delay circuit shown in FIG. 4, however, defects described above do not exist, but instead, it is necessary to accumulate among inverters on the semiconductor tip to obtain a predetermined interval, because the delay at each inverter is very slight, and thus the circuit scale is increased. Further, an increase in the number of inverters leads to an increase in the power consumption.

SUMMARY OF THE INVENTION

The object of the present invention is to provide a small-scale delay circuit having a low power consumption, a stable delay time regardless of changes in the direction of the voltage at the input terminal, and able to operate reliably and to obtain a sufficient delay time at a low power source voltage.

According to the present invention, the delay circuit is composed of a first switching transistor and a second switching transistor operating in a complementary manner in response to an input signal, an output terminal connected to the node of the first switching transistor and the second switching transistor, one or more switching transistors of the same type as the first switching transistor provided between the first switching transistor and a power source, one or more switching transistors of the same type as the second switching transistor provided between the first switching transistor and another power source, one or more current paths connecting at least one pair of nodes, one of which nodes being located between the first switching transistor and the power source and the other nodes being located between the second switching transistor and the other power source, and one or more capacitors connected to the current paths. This delay circuit is small-scale, has a low power consumption, a stable delay time regardless of changes in the direction of the voltage at the input terminal, and can operate reliably and to obtain a sufficient delay time at a low power source voltage.

BRIEF DESCRIPTION OF THE DRAWINGS

The present invention will be more clearly understood from the description as set forth below with reference to the accompanying drawings, wherein.

DESCRIPTION OF THE PREFERRED EMBODIMENTS

Figure 7:
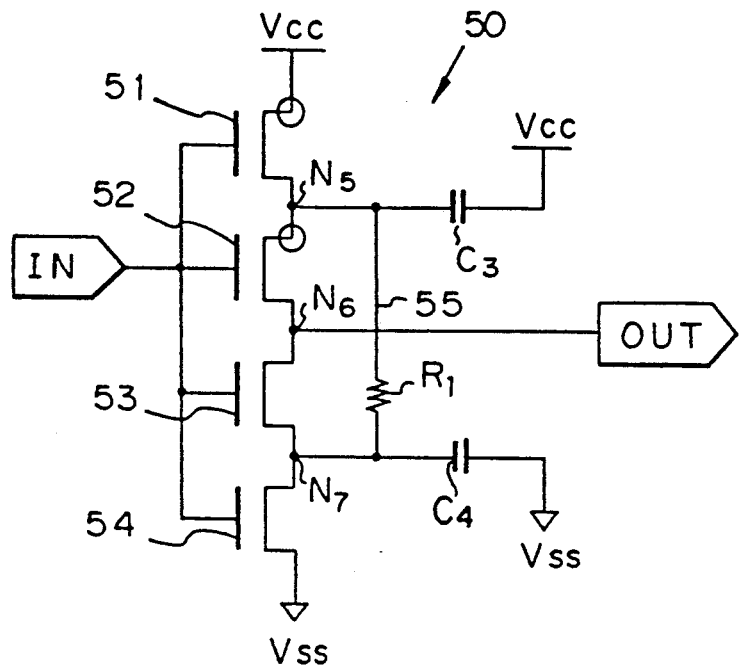
FIG. 7 is a circuit diagram of a first embodiment of a delay circuit according to the present invention.

FIG. 7 is a circuit diagram of a first embodiment of a delay circuit 50 according to the present invention. The delay circuit 50 is composed of two P-channel FET's 51 and 52, two N-channel FET's 53 and 54, two capacitors $C_3$ and $C_4$, and a resistor R. The P-channel FET's 51 and 52, and N-channel FET's 53 and 54 are connected in series between a high level constant power supply Vcc and a low level constant power supply Vss. The gates of the FET's 51, 52, 53 and 54 are connected to an input terminal IN. A node $N_5$ and a node $N_7$ are connected by a current path 55 which has a resistor $R_1$. A node $N_6$ is connected to an output terminal OUT. Further, the capacitor $C_3$ is connected to the current path 55, between the node $N_5$ and the resistor $R_1$, and the capacitor $C_4$ is connected to the current path 55 between the node $N_7$ and the resistor $R_1$. The free terminal of the capacitor $C_3$ is connected to the high level constant power supply Vcc, and the free terminal of the capacitor $C_4$ is connected to the low level constant power supply Vss.

When metal-oxide-semiconductor field effect transistors (MOSFET) as employed the FET's 51, 52, 53, and 54, the capacitors $C_3$ and $C_4$ are formed by the MOSFET's by connecting the source and the drain thereof. Namely, if the source and the drain of a MOSFET are connected to the high level constant power supply Vcc and a gate of the MOSFET is connected to the current path 55 between the node $N_5$ and the resistor $R_1$, the MOSFET acts as the capacitor $C_3$.

Figure 8A:
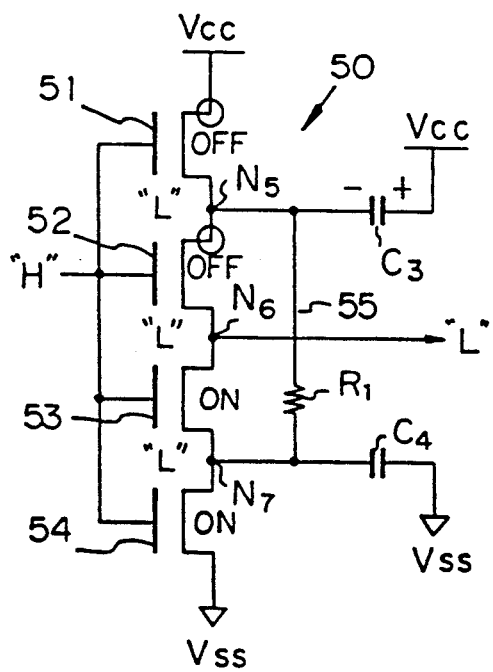
FIGS. 8A and 8B are circuit diagrams of FIG. 7 showing a delay operation when the input signal is changed from high level to low level.

FIGS. 8A, 8B, 8C, and 8D explain the operation of the delay circuit 50 shown in FIG. 7. In FIG. 8A, the signal input to the input terminal IN shown in FIG. 7 is high level "H". Under this condition, the P-channel FET's 51 and 52 are OFF, and the N-channel FET's 53 and 54 are ON, and the nodes $N_5$, $N_6$, and $N_7$ are all low levels "L", whereby the capacitor $C_3$ is charged and the capacitor $C_4$ is discharged.

Figure 8B:
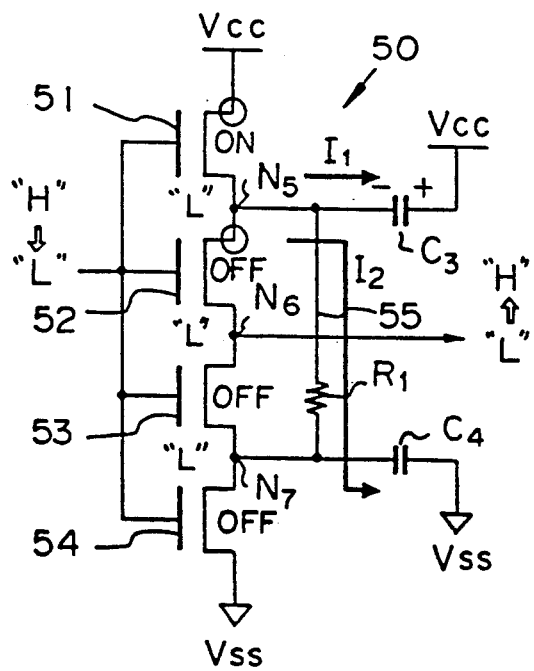
Figure 8C:
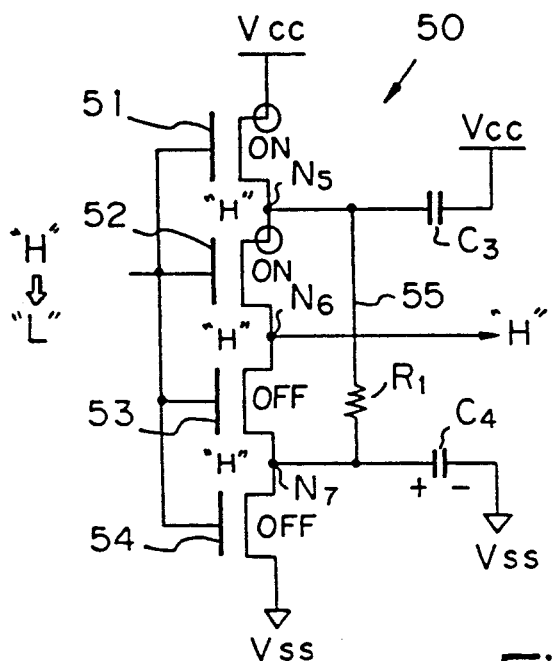
FIGS. 8C and 8D are circuit diagrams of FIG. 7 showing a delay operation when the input signal is changed from low level to high level.

When the signal input to the input terminal IN changes from high level "H" to low level "L", as shown in FIG. 8B, the P-channel FET 51 becomes ON immediately the input level becomes lower than the threshold voltage, and the N-channel FET's 53 and 54 become OFF immediately the input level becomes lower than the threshold voltage. The P-channel FET 52, however, cannot become ON at this time because the nodes $N_5$ and $N_6$ are still low levels. When the P-channel FET 51 is turned ON, current flows through the FET 51, and a current $I_1$ discharges the capacitor $C_3$, and at the same time, a current $I_2$ flows through the resistor $R_1$ to charge the capacitor $C_4$. After the capacitor $C_3$ is discharged and the capacitor $C_4$ is charged, the voltage level at the node $N_5$ is pulled up to high level "H", the P-channel FET 52 is turned ON, and current flows through the FET 52 to change the voltage at the output terminal OUT from low level "L" to high level "H". Accordingly, when the input signal level is changed from high "H" to low "L", the level of the output signal is changed from low "L" to high "H" after a specified interval defined by the capacity of the capacitors $C_3$ and $C_4$. When the P-channel FET's 51 and 52 are ON, the N-channel FET's 53 and 54 are OFF, the nodes $N_5$, $N_6$, and $N_7$ are all at high level "H", and the capacitor $C_3$ is charged and the capacitor $C_4$ is discharged, as shown in FIG. 8C.

Figure 8D:
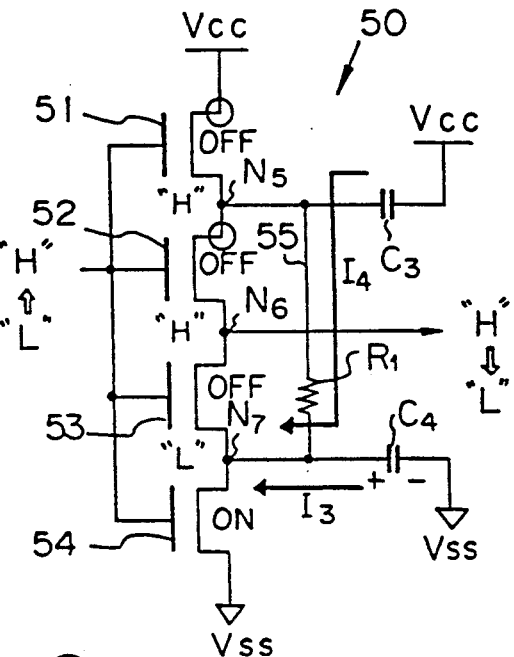

Conversely, when the signal input to the input terminal IN is changed from low level "L" to high level "H" as shown in FIG. 8D, the N-channel FET 54 becomes ON immediately the input level exceeds the threshold voltage, and the P-channel FET's 51 and 52 become OFF immediately the input exceeds the threshold voltage. The N-channel FET 53, however, cannot become ON at the same time because the nodes $N_6$ and $N_7$ are both high levels. When the N-channel FET 54 is turned ON, current flow through the FET 54, and a current $I_3$ discharge the capacitor $C_4$, and at the same time, a current $I_4$ flows through the resistor $R_1$ to charge the capacitor $C_3$. After the capacitor $C_4$ is discharged and the capacitor $C_3$ is charged, the voltage level at the node $N_7$ is pulled down to low level "L", the N-channel FET 53 is turned ON, and current flows through the FET 53 to change the voltage at the output terminal OUT from high level "H" to low level "L". Accordingly, when the level of the input signal changes from low "L" to high "H", the level of the output signal is changed from high "H" to low "L" after a specified interval defined by the capacities of the capacitor $C_3$ and $C_4$. When the P-channel FET's 51 and 52 are OFF, the N-channel FET's 53 and 54 are ON, the nodes $N_5$, $N_6$, and $N_7$ are all at low levels "L", and the capacitor $C_3$ is discharged and the capacitor $C_4$ is charged, as shown in FIG. 8A.

Figure 9:
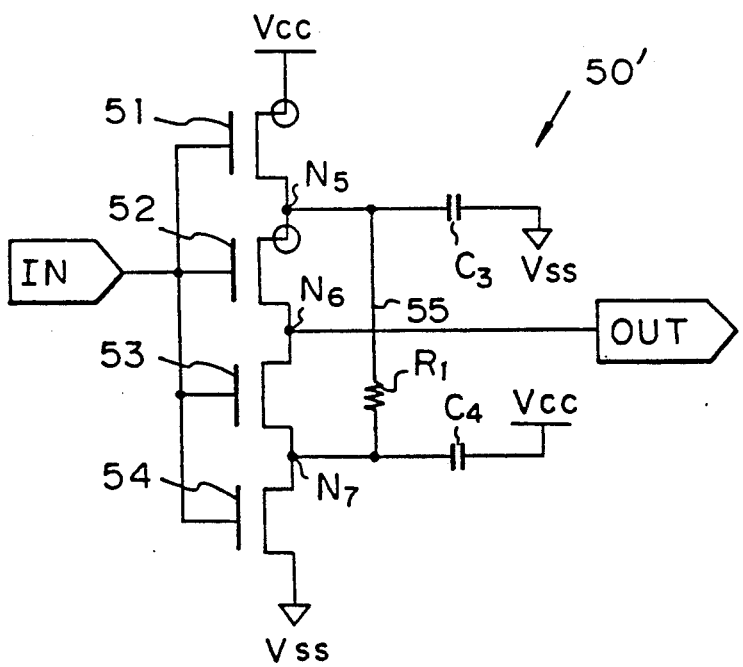
FIG. 9 is a circuit diagram of a modification of the first embodiment shown in FIG. 7.

FIG. 9 is a circuit diagram of a modification of the first embodiment shown in FIG. 7. In FIG. 9, the delay circuit 50' is also composed of two P-channel FET's 51 and 52, two N-channel FET's 53 and 54, two capacitors $C_3$ and $C_4$, and a resistor $R_1$, and the connections therebetween are the same as the delay circuit 50 shown in FIG. 7, except for the connection of the free terminals of the capacitors $C_3$ and $C_4$. Namely, the free terminal of the capacitor $C_3$ is connected to the low level constant power supply Vss and the free terminal of the capacitor $C_4$ is connected to the high level constant power supply Vcc in this embodiment, but the free terminal of the capacitor $C_3$ is connected to the high level constant power supply Vcc and the free terminal of the capacitor $C_4$ is connected to the low level constant power supply Vss in FIG. 7. In this modification, the delay operation of the circuit 50' is the same as the operation of the delay circuit 50 shown in FIG. 7, except that the charge and discharge operations of the capacitors $C_3$ and $C_4$ are reversed.

Figure 10A:
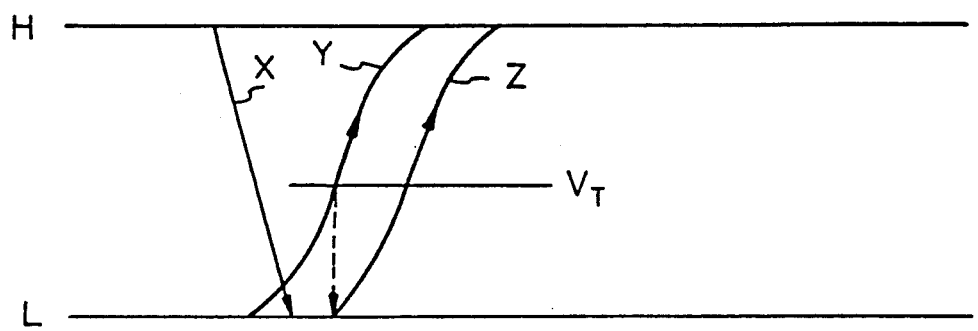
FIG. 10A is a waveform diagram of the delay circuit shown in FIGS. 7 and 9, for explaining the operations of the delay circuits when the time constant value is small.

FIG. 10A is a waveform diagram of the delay circuit shown in FIGS. 7 and 9, for explaining the operations of the delay circuits when the time constant value decided by the capacitance of the capacitors $C_3$ and $C_4$ and the resistance of the resistor $R_1$ is small. When the level of the input terminal IN changes from high level "H" to low level "L", as indicated by the reference numeral X in FIG. 10A, the level of the node $N_5$ changes from low level "L" to high level "H", as indicated by the reference numeral Y, in accordance with the small time constant. In the process of an increment of the level of the node $N_5$, the P-channel FET 52 turns ON when the level of the node $N_5$ exceeds the threshold level $V_T$. After the FET 52 is turned ON, the level of the output terminal OUT is changed from low level "L" to high level "H", as indicated by the reference numeral Z.

Figure 10B:
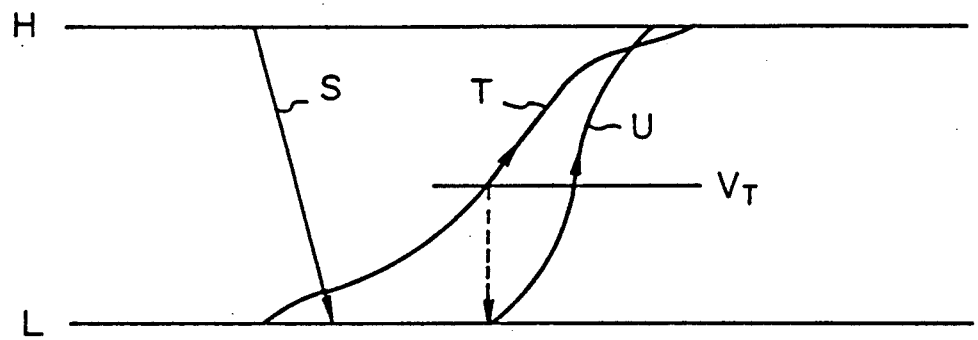
FIG. 10B is a waveform diagram of the delay circuit shown in FIGS. 7 and 9, for explaining the operations of the delay circuits when the time constant value is large.

FIG. 10B is a waveform diagram of the delay circuit shown in FIGS. 7 and 9, for explaining the operations of the delay circuits when the time constant value is large. Under this circumstance, when the level of the input terminal IN changes from high level "H" to low level "L", as indicated by the reference numeral S in FIG. 10B, the level of the node $N_5$ slowly changes from low level "L" to high level "H" as indicated by the reference numeral T, in accordance with the large time constant In the process of a slow increment of the level of the node $N_5$, the P-channel FET 52 turns ON when the level of the node $N_5$ exceeds the threshold level $V_T$. After the FET 52 is turned to ON, the level of the output terminal OUT changed from low level "L" to high level "H" as indicated by the reference numeral U at the same speed as that when the time constant value is small.

Figure 1:
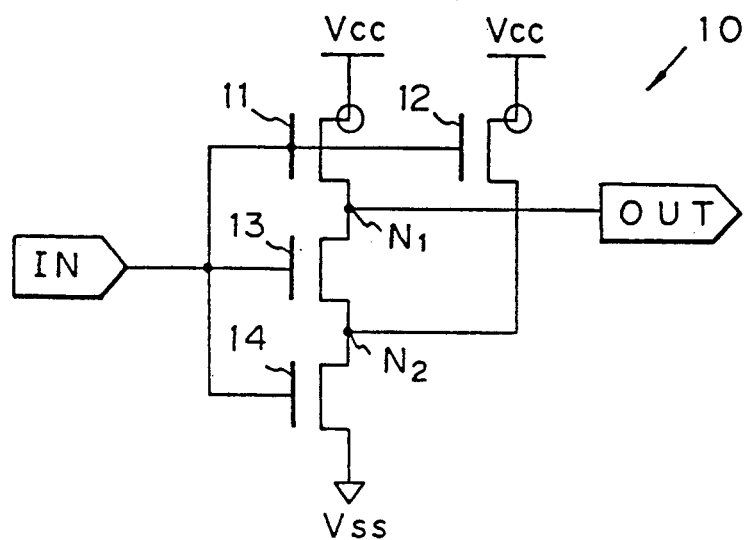
FIG. 1 is a prior art circuit diagram of a delay circuit including a Schmitt trigger circuit.
Figure 2:
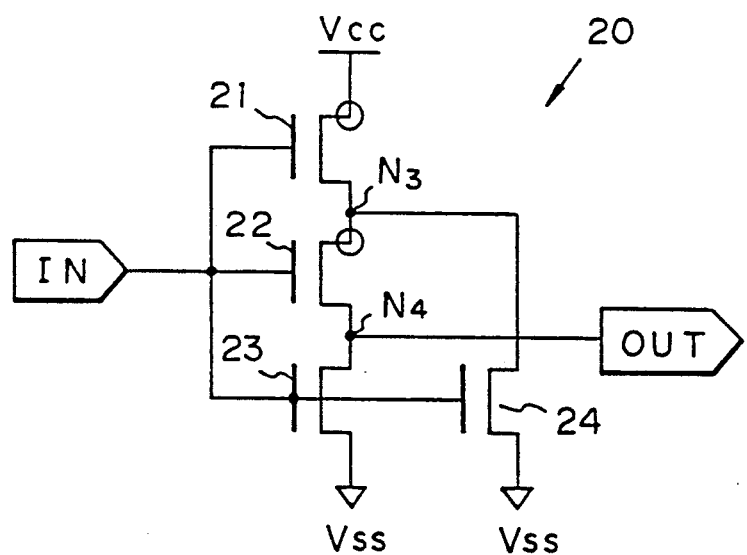
FIG. 2 is a prior art circuit diagram of a delay circuit including another type of Schmitt trigger circuit.
Figure 3:
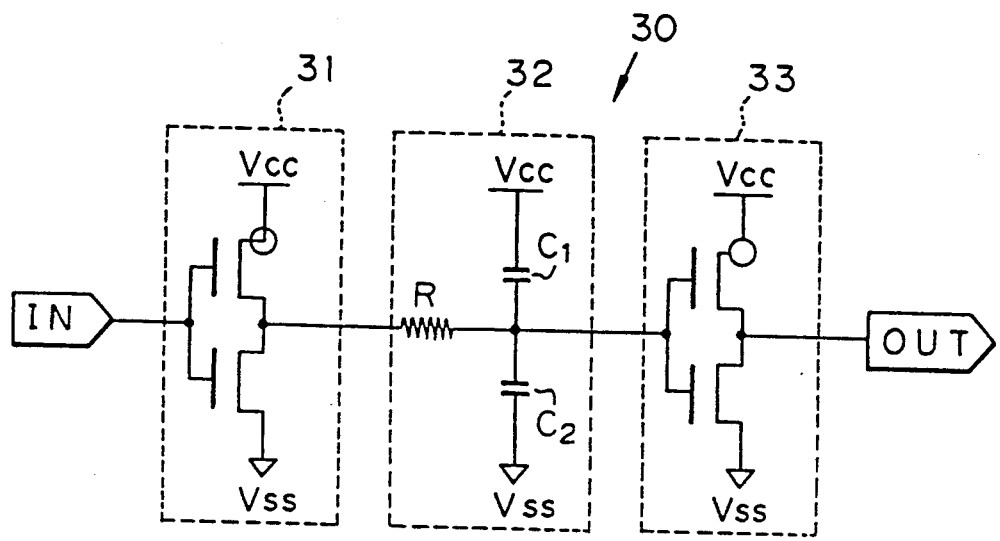
FIG. 3 is a prior art circuit diagram of a delay circuit including a network of capacitors and a resistor.
Figure 4:
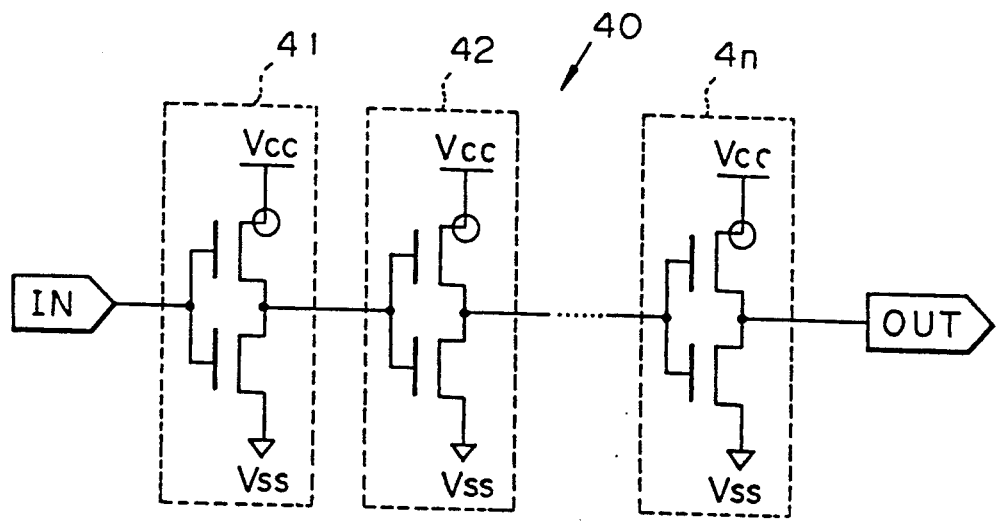
FIG. 4 is a prior art circuit diagram of a delay circuit including multistage inverters.
Figure 5A:
FIGS. 5A, 5B, 5C, 5D, 5E, and 5F are waveform diagrams showing waveforms of the prior art and of the present invention when the voltage of a high level constant power supply Vcc is 5 V, for explaining the operations of the delay circuits of the prior art and of the present invention.
Figure 5B:
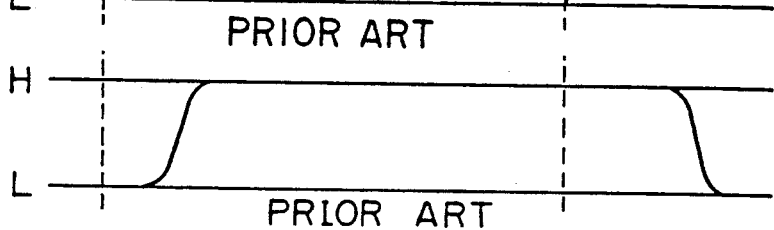
Figure 5C:
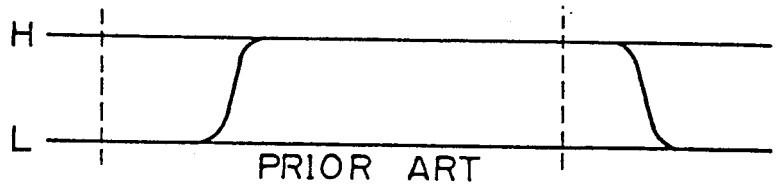
Figure 5D:
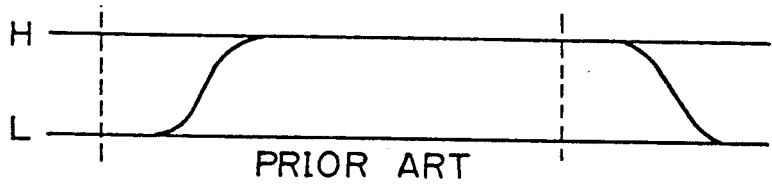
Figure 5E:
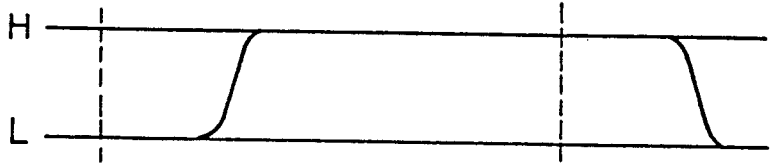
Figure 5F:
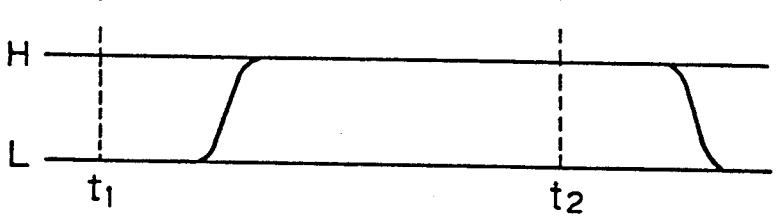
Figure 6A:
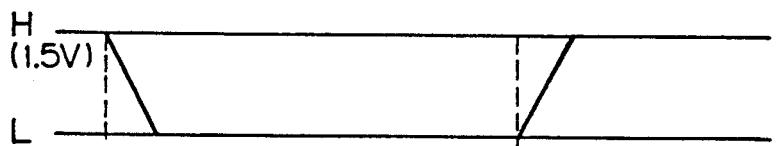
FIGS. 6A, 6B, 6C, 6D, 6E, and 6F are waveform diagrams including waveforms of the prior art and of the present invention when the voltage of a high level constant power supply Vcc is 1.5 V, for explaining the operations of the delay circuits of the prior art and of the present invention.
Figure 6B:
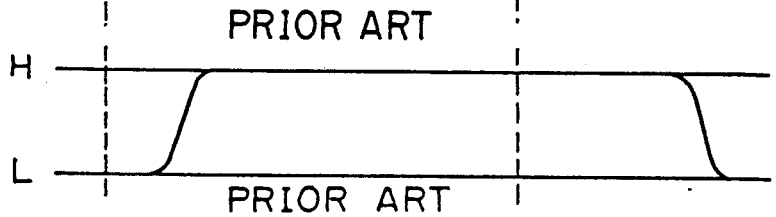
Figure 6C:
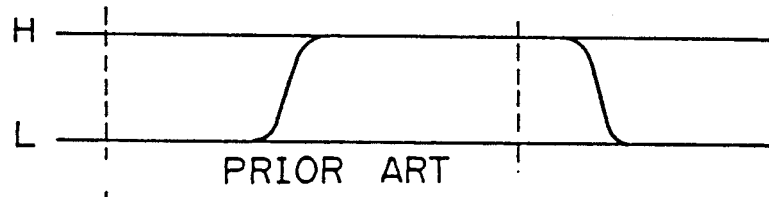
Figure 6D:
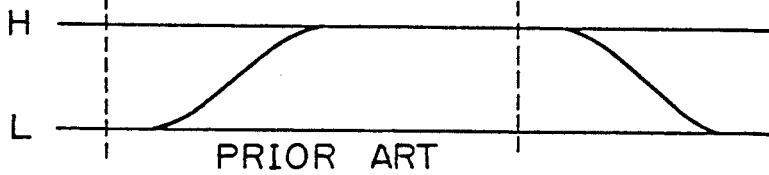
Figure 6E:
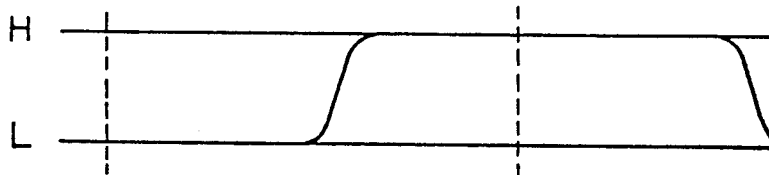
Figure 6F:
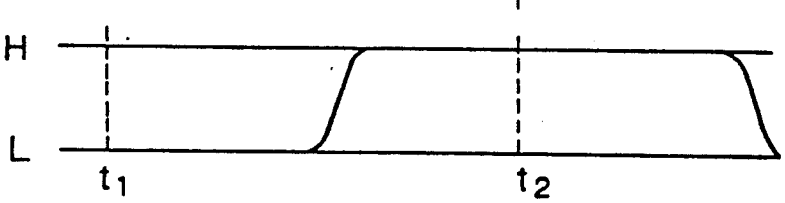

Returning to FIGS. 5A to 5F, FIGS. 5A and 5E show waveforms for explaining the operations of the delay circuits of the present invention as shown in FIGS. 7 and 9 when the voltage of the high level constant power supply Vcc is 5 V. The waveform in FIG. 5E indicates a signal output from the output terminal OUT of the circuits 50 and 50' when the input signal at the input terminal IN of the circuits 50 and 50' changes at time $t_1$ and time $t_2$. Returning to FIGS. 6A to 6F, FIGS. 6A and 6E show waveforms for explaining the operations of the delay circuits as shown in FIGS. 7 and 9 when the voltage of the high level constant power supply Vcc is less than 3 V, for example, 1.5 V. The waveform in FIG. 6E indicates a signal output from the output terminal OUT of the circuits 50 and 50' when the input signal at the input terminal IN of the circuits 50 and 50' changes at a time $t_1$ and time $t_2$. In comparing FIGS. 5E and 6E, it can be clearly seen that the time delay of the delay circuits 50 and 50', when the voltage of the high level constant power supply Vcc is 1.5 V, is longer than the time delay of the delay of the delay circuits 50 and 50' when the voltage of the high level constant power supply Vcc is 5 V. As illustrated in FIGS. 5E and 6E, it can be seen that the pulling-up time and pulling-down time at the delay circuits are almost the same.

As described above, the delay circuit in FIG. 7 or 9 transmits the input signal at the input terminal IN to the output terminal OUT at a predetermined interval when the input signal is rising or falling. Further, the delay circuit in FIGS. 7 or 9 requires only the capacitors $C_3$, $C_4$ and the resistor $R_1$ to obtain a reliable delay time, and thus the circuit is kept to a small scale. Furthermore, the delay circuit in FIGS. 7 or 9 operates effectively when the constant power source Vcc is at a low level.

Figure 11:
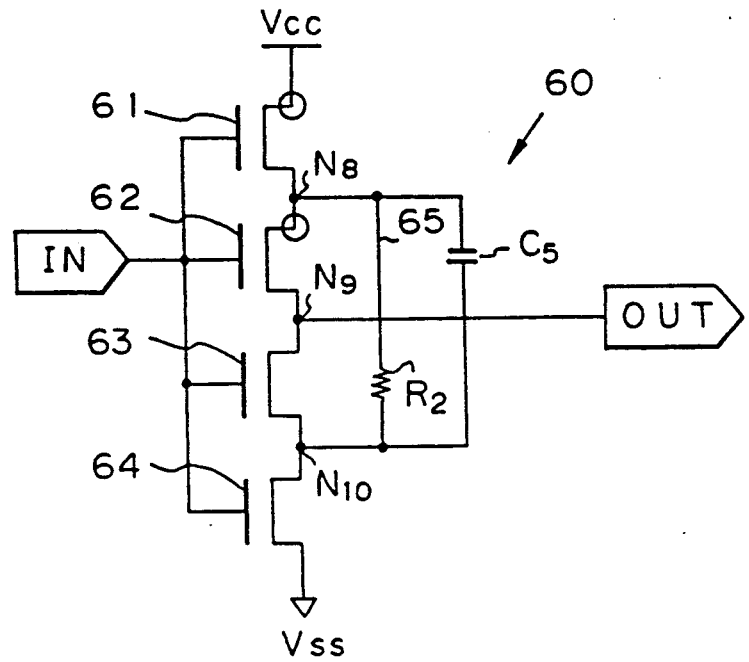
FIG. 11 is a circuit diagram of a second embodiment of a delay circuit according to the present invention.

FIG. 11 is a circuit diagram of a second embodiment of a delay circuit 60 according to the present invention. This delay circuit 60 is composed of two P-channel FET's 61 and 62, two N-channel FET's 63 and 64 supply Vss and the high level constant power supply Vcc, a current path 65 connecting nodes $N_8$ and $N_{10}$, a resistor $R_2$ provided on the current path 65, a capacitor $C_5$ connected to the current path 65 in parallel to the resistor $R_2$, and a node $N_9$ connected to the output terminal OUT.

In this second embodiment, the operation of the delay circuit 60 is almost the same as the operation of the delay circuit 50 shown in FIG. 7, except for the charge and discharge operation of the capacitor $C_5$. When the signal input to the input terminal IN is high level "H", two metal plates of the capacitor $C_5$ are given a negative electric charge because the nodes $N_8$ and $N_{10}$ are both low level. When the signal input to the input terminal IN is low level "L", the two metal plates of the capacitor $C_5$ are given a positive electric charge because the nodes $N_8$ and $N_{10}$ are both high levels. Accordingly, the charge or discharge operation of the capacitor $C_5$, which decides the delay time of the delay circuit 60, occurs at the transition of the input signal. The waveform-characteristics of the input terminal IN and the output terminal OUT are shown in FIGS. 5A and 5F (when the voltage of the high level constant power supply Vcc is 5 V), and in FIGS. 6A and 6F (when the voltage of the high level constant power supply Vcc is 1.5 V). From FIGS. 5F and 6F, it is clearly understood that the delay circuit 60 works effectively when the constant power source Vcc is at a low level.

Figure 12:
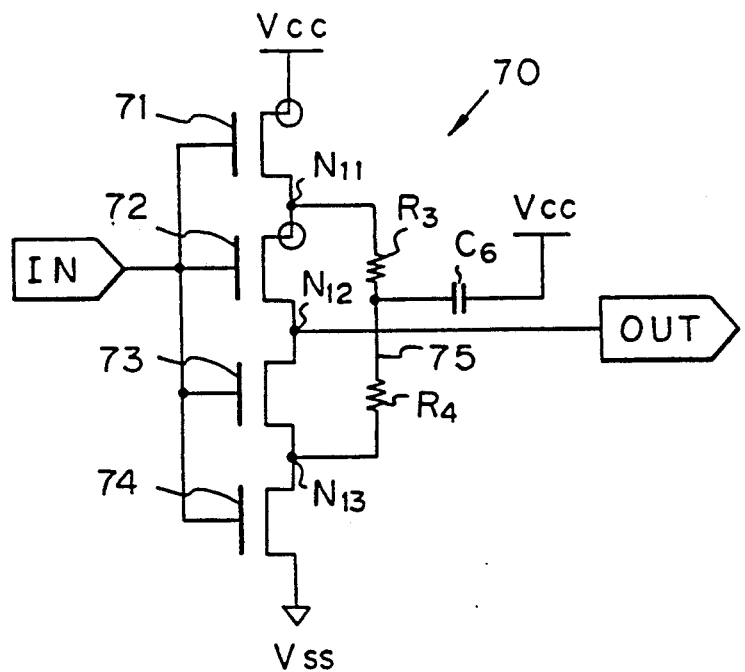
FIG. 12 is a circuit diagram of a third embodiment of a delay circuit according to the present invention.

FIG. 12 is a circuit diagram of a third embodiment of a delay circuit 70 according to the present invention. This delay circuit 70 is composed of two P-channel FET's 71 and 72, two N-channel FET's 73 and 74 connected in series between the low level constant power supply Vss and the high level constant power supply Vcc, a current path 75 connecting nodes $N_{11}$ and $N_{13}$, resistors $R_3$ and $R_4$ connected in series on the current path 75, a capacitor $C_6$, and a node $N_{12}$ connected to the output terminal OUT. In this embodiment, the capacitor $C_6$ is connected to the current path 75 at the point at which the resistor $R_3$ and $R_4$ are connected thereto, and the free terminal of this capacitor $C_6$ is connected to the high level constant power supply Vcc. In this third embodiment, operation of the delay circuit 70 is almost the same as the operation of the delay circuit 50 shown in FIG. 7, except for charge and discharge operations of the capacitor $C_6$. When the signal input to the input terminal IN is high level "H", the capacitor $C_6$ is charged because the nodes $N_{11}$ and $N_{13}$ are low level and the constant power supply Vcc is high level. When the signal input to the input terminal IN is changed from high level "H" to low level "L", the capacitor $C_6$ is discharged because the level of the nodes $N_{11}$ and $N_{13}$ is changed from low to high. When the signal input to the input terminal IN is changed from low level "L" to high level "H", the capacitor $C_6$ is charged because the levels of the nodes $N_{11}$ and $N_{13}$ are changed from high to low. Accordingly, the charge and discharge operations of the capacitor $C_6$ decide the delay time of the delay circuit 70 in accordance with the time constant decided by the capacitance of the capacitor $C_6$ and the resistance of the resistors $R_3$ and $R_4$.

Figure 13:
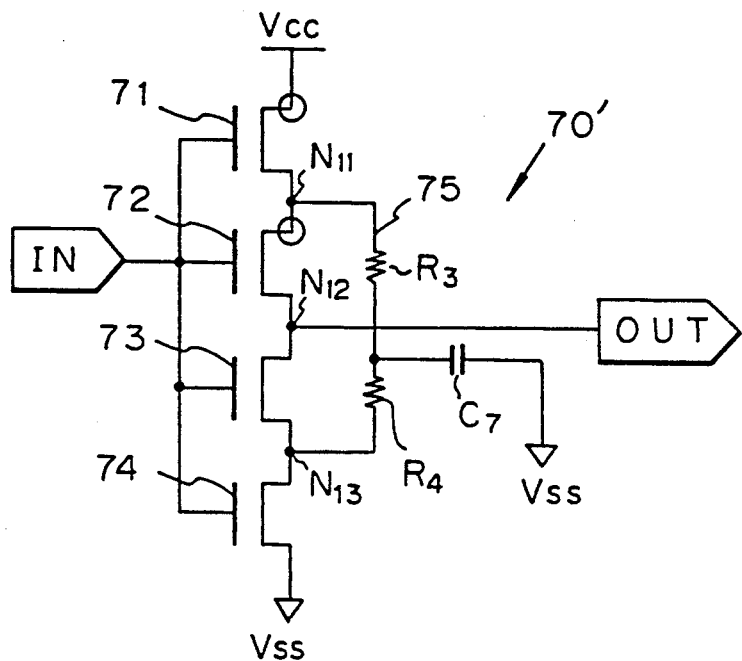
FIG. 13 is a circuit diagram of a modification of the third embodiment as shown in FIG. 12.

FIG. 13 is a circuit diagram of a modification of the third embodiment as shown in FIG. 12. The construction of the delay circuit 70' is the same as that of the delay circuit 70 shown in FIG. 12, except for the connection of the free terminal of the capacitor $C_7$. Namely, the free terminal of the capacitor $C_7$ is connected to the low level constant power supply Vss in this embodiment, but is connected to the high level constant power supply Vcc in FIG. 12. In this modification, the operation of the delay circuit 70' is the same as the operation of the delay circuit 70 shown in FIG. 12, except the charge and discharge operations of the capacitor $C_7$ are reversed.

Figure 14:
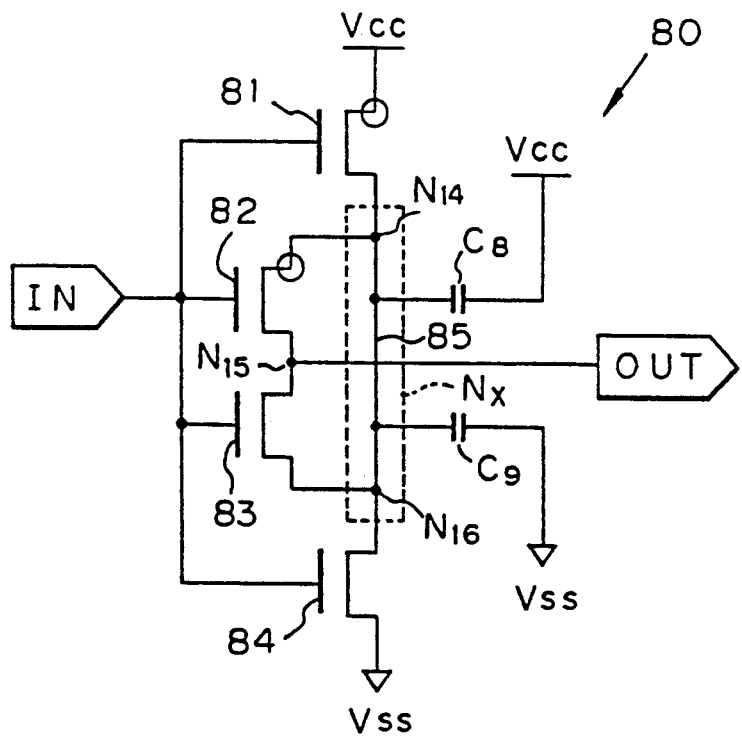
FIG. 14 is a circuit diagram of a fourth embodiment of a delay circuit according to the present invention.

FIG. 14 is a circuit diagram of a fourth embodiment of a delay circuit according to the present invention. This delay circuit 80 is composed of two P-channel FET's 81 and 82, two N-channel FET's 83 and 84 connected in series between the low level constant power supply Vss and the high level constant power supply Vcc, a current path 85 connecting nodes $N_{14}$ and $N_{16}$, capacitors $C_8$ and $C_9$ connected to a different point of the current path 85, and a node $N_{15}$ connected to the output terminal OUT. In this embodiment, a free terminal of the capacitor $C_8$ is connected to the high level constant power supply Vcc, and a free terminal of the capacitor $C_9$ is connected to the low level constant power supply Vss. Note, the connection of the free terminals of the capacitors $C_8$ and $C_9$ may be reversed. Since the current path itself has a slight line-resistance, the operation of this delay circuit 80 is the same as that of the delay circuit 50 shown in FIG. 7.

As a modification of the delay circuit 80 as shown in FIG. 14, the following circuits (not shown) can be formed: (a) a circuit wherein one of the capacitors $C_8$ and $C_9$ is removed from the delay circuit 80; (b) a circuit wherein one or more resistors are provided on the current path 85 of the circuit in FIG. 14 or the circuit described in (a). Further, the part surrounded by a dot-like Nx may be treated as a common node including the nodes $N_{14}$ and $N_{16}$.

Figure 15:
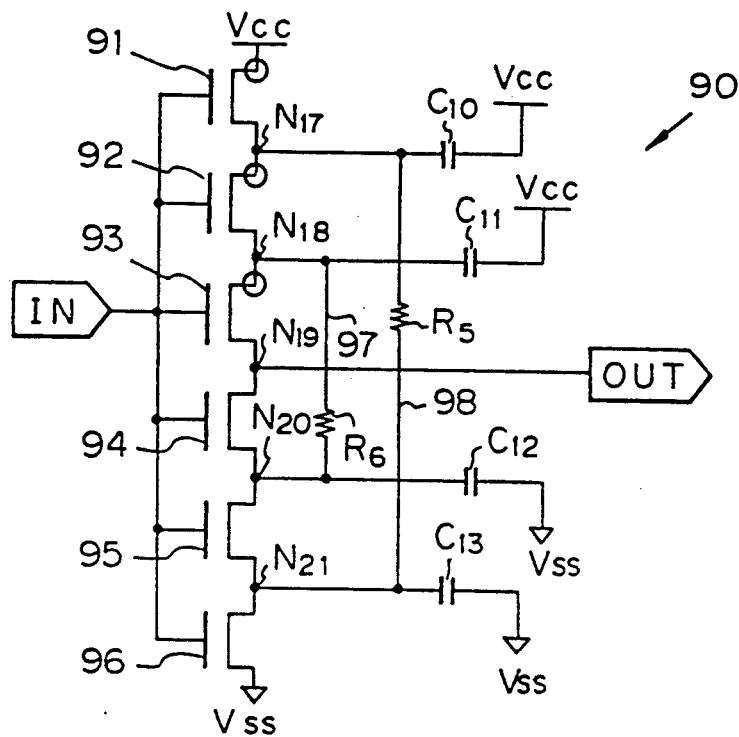
FIG. 15 is a circuit diagram of a fifth embodiment of a delay circuit according to the present invention.

FIG. 15 is a circuit diagram of a fifth embodiment of a delay circuit 90 according to the present invention. Three P-channel FET's 91, 92, 93, three N-channel FET's 94, 95, 96, current paths 97 and 98, four capacitors $C_{10}$, $C_{11}$, $C_{12}$, and $C_{13}$, and resistors $R_5$ and $R_6$ are used in the delay circuit 90, and the connection of the FET's 92, 93, 94, 95, the current path 97, the capacitors $C_{11}$ and $C_{12}$, and the resistor $R_6$ are the same as for the delay circuit 50 shown in FIG. 7. In this embodiment, the FET 91 is added between the FET 92 and the high level constant power source Vcc, the FET 96 is added between the FET 95 and the low level constant power source Vss, a current path 98 provided with a resistor $R_5$ is added between nodes $N_{17}$ and $N_{21}$, and capacitors $C_{10}$ and $C_{13}$ are added to the current path 98. The operation of the delay circuit 90 is similar to the delay operation described in FIG. 7, i.e., when the input signal changes from high level "H" to low level "L", the FET's 91, 92, and 93 become ON, in this order, at a predetermined interval therebetween them, and when the input signal changes from low level "L" to high level "H", the FET's 96, 95, and 94 become ON, in this order, also at a predetermined interval therebetween. Accordingly, in the delay circuit 90 shown in FIG. 15, the delay time is longer than that in the delay circuits shown in FIGS. 7, 9, 11, 12, 13, and 14.

Figure 16:
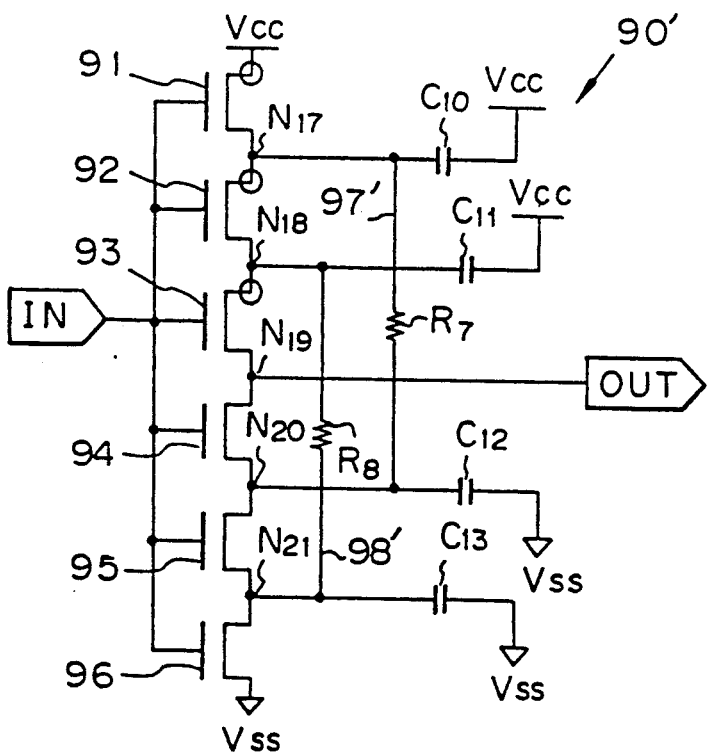
FIG. 16 is a circuit diagram of a modification of the fifth embodiment as shown in FIG. 15.

FIG. 16 shows a delay circuit 90' as a modifications of the delay circuit 90 shown in FIG. 15. In this embodiment, the connection of the nodes $N_{17}$, $N_{18}$, $N_{20}$ and $N_{21}$ are different from those of FIG. 15. Namely, in this embodiment, the nodes $N_{17}$ and $N_{20}$ are connected by a current path 97' and the nodes $N_{18}$ and $N_{21}$ are connected by a current path 98'. The operation of this delay circuit is similar to that of the delay circuit 90 shown in FIG. 15.

Figure 17:
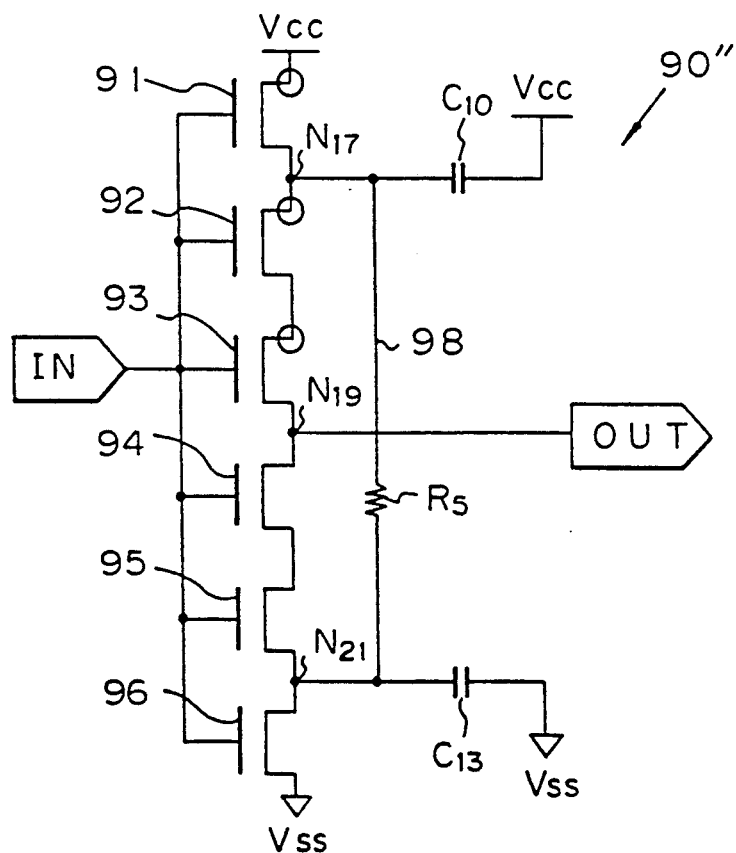
FIG. 17 is a circuit diagram of another modification of the fifth embodiment as shown in FIG. 15.

FIG. 17 shows a delay circuit 90" as another modification of the delay circuit 90 as shown in FIG. 15. In this embodiment, the current path 97 and capacitors $C_{11}$ and $C_{12}$ are removed from the delay circuit 90 in FIG. 15, and thus the delay time is longer than that in the delay circuit shown in from FIGS. 7, 9, 11, 12, 13, and 14 but shorter than that in the delay circuit shown in FIGS. 15 and 16.

While the invention has been particularly shown and described in reference to preferred embodiments thereof, it will be understood by those skilled in the art that changes in form and details may be made therein without departing from the spirit and scope of the invention.

We claim:

1. A delay circuit comprising:

a first switching transistor and a second switching transistor operating in a complementary manner in response to an input signal;

an output terminal connected to a node commonly connected to said first switching transistor and said second switching transistor;

at least one switching transistor of the same type as said first switching transistor provided between said first transistor and a power source line;

at least one switching transistor of the same type as said second switching transistor provided between said second transistor and another power source line;

at least one current path connecting at least one pair of nodes, wherein at least one node of said pair of nodes being connected by said at least one current path is located between said first switching transistor and said power source line, and wherein another node of said pair of nodes is located between said second switching transistor and said another power source line;

at least one capacitor connected to said at least one current path.

2. A delay circuit as set forth in claim 1, wherein said current path has a resistance.

3. A delay circuit as set forth in claim 2, wherein a single capacitor is connected to said current path and a free terminal is connected to a power source line having a predetermined potential.

4. A delay circuit as set forth in claim 3, further comprising resistors connected to said capacitor in said current path, said resistors providing said resistance.

5. A delay circuit as set forth in claim 4, wherein said power source line is a positive power source line.

6. A delay circuit as set forth in claim 4, wherein said power source line is a negative power source line.

7. A delay circuit as set forth in claim 1, wherein free terminals of said at least one capacitor are connected to a power source line having a predetermined potential.

8. A delay circuit as set forth in claim 1, wherein two capacitors are connected to said current paths respectively, wherein each of said current paths shares a predetermined resistance connected between said two capacitors, and each of said free terminals is connected to a different power source line having a different predetermined potential.

9. A delay circuit as set forth in claim 8, wherein said different power source lines are a positive power source line and a negative power source line.

10. A delay circuit as set forth in claim 8, further comprising a resistor in said current path for providing said predetermined resistance.

11. A delay circuit as set forth in claim 10, wherein said different power source lines are a positive power source line and a negative power source line.

12. A delay circuit as set forth in claim 1, wherein said capacitor is connected in parallel to said current path, and wherein said current path parallel to said capacitor has a predetermined resistance.

13. A delay circuit as set forth in claim 12, further comprising a resistor in said current path for providing said predetermined resistance.

14. A delay circuit as set forth in claim 1, wherein a single switching transistor of the same type as said first switching transistor is provided between said first transistor and a power source line, a single switching transistor of the same type as said second switching transistor is provided between said second transistor and another power source line, and a single current path connects a pair of nodes, one of said pair of nodes being located between said first switching transistor and said single switching transistor of the same type as said first switching transistor and the other of said pair of nodes being located between said second switching transistor and said single switching transistor of the same type as said second switching transistor.

15. A delay circuit as set forth in claim 14, wherein two capacitors are respectively connected, one each to said single current path, wherein each of said current paths shares a predetermined resistance connected between said two capacitors, and a different power source line having a different predetermined potential is respectively connected to a different power source line.

16. A delay circuit as set forth in claim 15, wherein said different power source lines are a positive power source line and a negative power source line.

17. A delay circuit as set forth in claim 15, further comprising a resistor provided in said current path for providing said predetermined resistance.

18. A delay circuit as set forth in claim 17, wherein said different power source lines are a positive power source line and a negative power source line.

19. A delay circuit as set forth in claim 14, wherein a single capacitor is connected to said current path and a free terminal is connected to a power source line having a predetermined potential.

20. A delay circuit as set forth in claim 19, wherein said current path has a resistance.

21. A delay circuit as set forth in claim 20, further comprising resistors connected to said capacitor in said current path, said resistors providing said predetermined resistance.

22. A delay circuit as set forth in claim 19, wherein said power source line is a positive power source line.

23. A delay circuit as set forth in claim 22, wherein said current path has a resistance.

24. A delay circuit as set forth in claim 23, further comprising resistors connected to said capacitor in said current path, said resistors providing said resistance.

25. A delay circuit as set forth in claim 19, wherein said power source line is a negative power source line.

26. A delay circuit as set forth in claim 25, wherein said current path has a resistance.

27. A delay circuit as set forth in claim 26, further comprising resistors connected to said capacitor in said current path, said resistors providing said resistance.

28. A delay circuit as set forth in claim 14, wherein said capacitor is connected in parallel to said current path, and wherein a portion of said current path in parallel to said capacitor has a predetermined resistance.

29. A delay circuit as set forth in claim 28, further comprising a resistor in said current path for providing said resistance.

30. A delay circuit as set forth in claim 1, wherein two switching transistors of the same type as first switching transistor are provided between said first transistor and a power source line, two switching transistors of the same type as said second switching transistor are provided between said second transistor and another power source line, and at least one current path connected to said each of said pair of nodes, one of said pair of nodes being located between said first switching transistor and said power source line and the other of said pair of nodes being located between said second switching transistor and said another power source line.

31. A delay circuit as set forth in claim 30, wherein two capacitors re connected to said current paths respectively, wherein each of said current paths between points at which said two capacitors are connected has a predetermined resistance, and each of said free terminals is connected to a different power source line having a different predetermined potential.

32. A delay circuit as set forth in claim 31, wherein said different power source lines are a positive power source line and a negative power source line.

33. A delay circuit as set forth in claim 31, further comprising a resistor in said current path for providing said predetermined resistance.

34. A delay circuit as set forth in claim 33, wherein said different power sourced lines are a positive power source line and a negative power source line.

35. A delay circuit as set forth in claim 30, wherein a single capacitor is connected to said current path respectively and a free terminal is connected to a power source line having a predetermined potential.

36. A delay circuit as set forth in claim 35, wherein said current path has a resistance.

37. A delay circuit as set forth in claim 36, wherein said resistance is provided by resistors connected to said capacitor in said current path.

38. A delay circuit as set forth in claim 35, wherein said power source line is a positive power source line.

39. A delay circuit as set forth in claim 38, wherein said current path has a resistance.

40. A delay circuit as set forth in claim 39, further comprising resistors connected to said capacitor in said current path, said resistors providing said resistance.

41. A delay circuit as set forth in claim 35, wherein said power source line is a negative power source line.

42. A delay circuit as set forth in claim 41, wherein said current path has a resistance.

43. A delay circuit as set forth in claim 42, further comprising resistors connected to said capacitor in said current path, said resistors providing said resistance.

44. A delay circuit as set forth in claim 30, wherein said capacitor is connected in parallel to said current path, and wherein a portion of said current path in parallel to said capacitor has a predetermined resistance.

45. A delay circuit as set forth in claim 44, further comprising a resistors provided in said current path for providing said resistance.

* * * * *